United States Patent [19]

Fukui

[11] Patent Number: 5,200,649

[45] Date of Patent: Apr. 6, 1993

[54] FLIP-FLOP CIRCUIT WITH DECREASED TIME REQUIRED FROM TAKE IN OF DATA INPUT TO SETTING OF DATA OUTPUT

[75] Inventor: Jiro Fukui, Yokohama, Japan

[73] Assignee: Sumitomo Electric Industries, Ltd., Osaka, Japan

[21] Appl. No.: 796,640

[22] Filed: Nov. 22, 1991

[30] Foreign Application Priority Data

Nov. 28, 1990 [JP] Japan ................................. 328326

[51] Int. Cl.$^5$ ..................... H03K 3/284; H03K 3/286; H03K 3/29
[52] U.S. Cl. ................................ 307/272.1; 307/475; 307/264; 307/279; 307/291
[58] Field of Search ............... 307/272.1, 272.2, 272.3, 307/264, 291, 557, 568, 540, 542, 443, 279, 475

[56] References Cited

U.S. PATENT DOCUMENTS

| 4,314,166 | 2/1982 | Bismarck ........................... 307/264 |
| 4,450,371 | 5/1984 | Bismarck ........................... 307/264 |
| 4,656,368 | 4/1987 | McCombs et al. ............... 307/272.2 |
| 4,982,111 | 1/1991 | Nakaizumi ........................ 307/291 |

FOREIGN PATENT DOCUMENTS 0068929  4/1982  Japan .................. 307/272.2

Primary Examiner—Timothy P. Callahan
Attorney, Agent, or Firm—Stevens, Davis, Miller & Mosher

[57] ABSTRACT

A high speed D-type flip-flop circuit comprises a data take-in circuit for taking in a data input at a timing synchronized with a clock input, a data hold circuit for holding a data output determined by the data input taken in by the data take-in circuit until the next data input take-in time, and a data output forced update circuit. When the data input is taken in, the output determined thereby is governed by the data output forced update circuit and updated thereby. Then, the signal determined by the data input is transferred to an output terminal through the data take-in circuit and the data hold circuit, and the data output is held until the next update time.

9 Claims, 7 Drawing Sheets

FLIP-FLOP CIRCUIT WITH DECREASED TIME REQUIRED FROM TAKE IN OF DATA INPUT TO SETTING OF DATA OUTPUT

BACKGROUND OF THE INVENTION

1. Field of the Invention

The present invention relates to a D-type flip-flop circuit, and more particularly to a flip-flop circuit which is a combination of logical gates used in a semiconductor integrated circuit and which takes in a data input in synchronism with a clock input, updates an output in accordance with the content of the data input and holds the output until the next update time.

2. Related Background Art

A prior art D-type flip-flop circuit of this type is shown in FIG. 1. It comprises six NOR gates 1–6. It takes in a data input D at a timing of a clock input CLK and transfers it to outputs Q and $\overline{Q}$. Of the NOR gates 1–6, the NOR gates 1–4 form a data take-in circuit 7, and the NOR gates 5 and 6 form a data hold circuit 8. The data take-in circuit 7 takes in the data input D at the timing synchronized with the clock input CLK. The data hold circuit 8 holds the data outputs Q and $\overline{Q}$ determined by the content of the data input D taken in by the data take-in circuit 7 until the next data take-in time which is synchronized with the clock input.

In the prior art circuit, the data must pass through the data take-in circuit 7 and the data hold circuit 8 in sequence after the clock input CLK changes to cause the data input take-in timing and a delay occurs before the output is set in accordance with the data input. As a result, the operation speed is low because of the delay times involved.

SUMMARY OF THE INVENTION

It is an object of the present invention to provide a flip-flop circuit having a short time from the take-in of the data input to the setting of the data output in accordance with the content of the data input.

It is another object of the present invention to provide a flip-flop circuit comprising a data take-in circuit for taking in a data input at a timing synchronized with a clock input, a data hold circuit for holding a data output determined by the data input taken in by said data take-in circuit until the next data input take-in time and a data output forced update circuit for temporarily setting the data output to a same voltage level as that which is updated by said data hold circuit in accordance with a control signal having the same transition timing as that of a signal applied to said data hold circuit by said data take-in circuit before the data output is updated by said data hold circuit to the level determined by the data input taken in by said data take-in circuit.

In order to achieve the above object, concretely the flip-flop circuit of the present invention has a data output forced updating circuit which temporarily sets the data output to a voltage level which is as substantially the same as that which will be updated by a data hold circuit in accordance with a control signal whose timing of change coincides with a signal applied to the data hold circuit by a take-in circuit, before the data output is updated by the data hold circuit to a value determined by the data input taken in by the take-in circuit.

Because the flip-flop circuit of the present invention have the data output forced update circuit when the data input is taken in, the output is governed by the data output forced update circuit and updated thereby. Then, the signal determined by the data input is transferred to the output terminal through the data take-in circuit and the data hold circuit of the flip-flop circuit and the data output is held until the next update time.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENT

Figure 1:
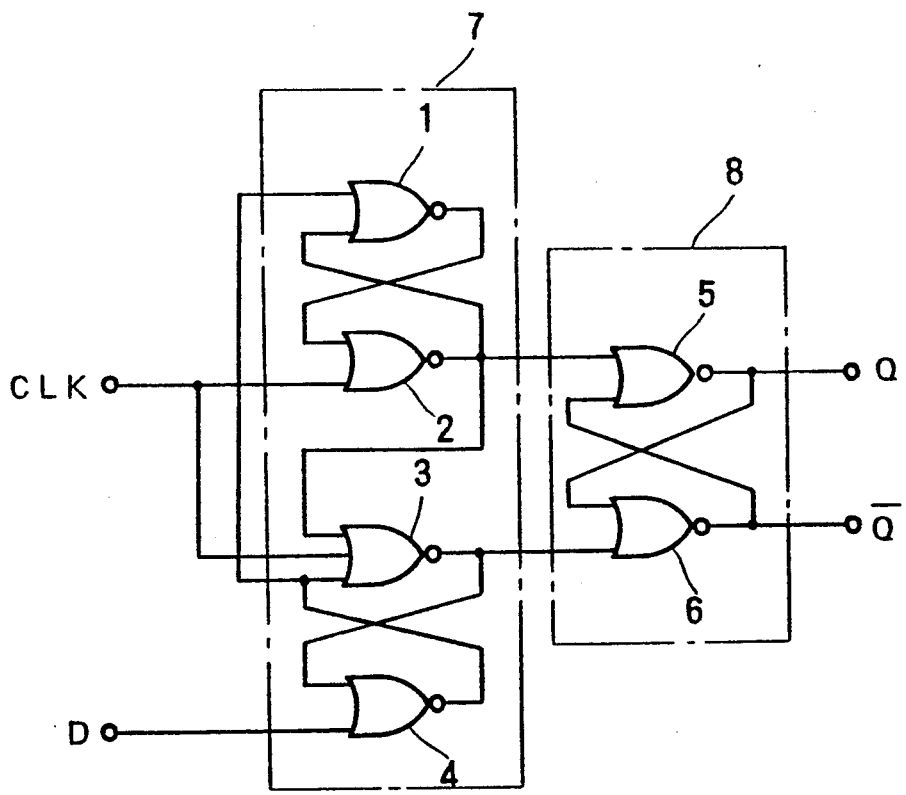
FIG. 1 shows a prior art D-type flip-flop circuit.
Figure 2:
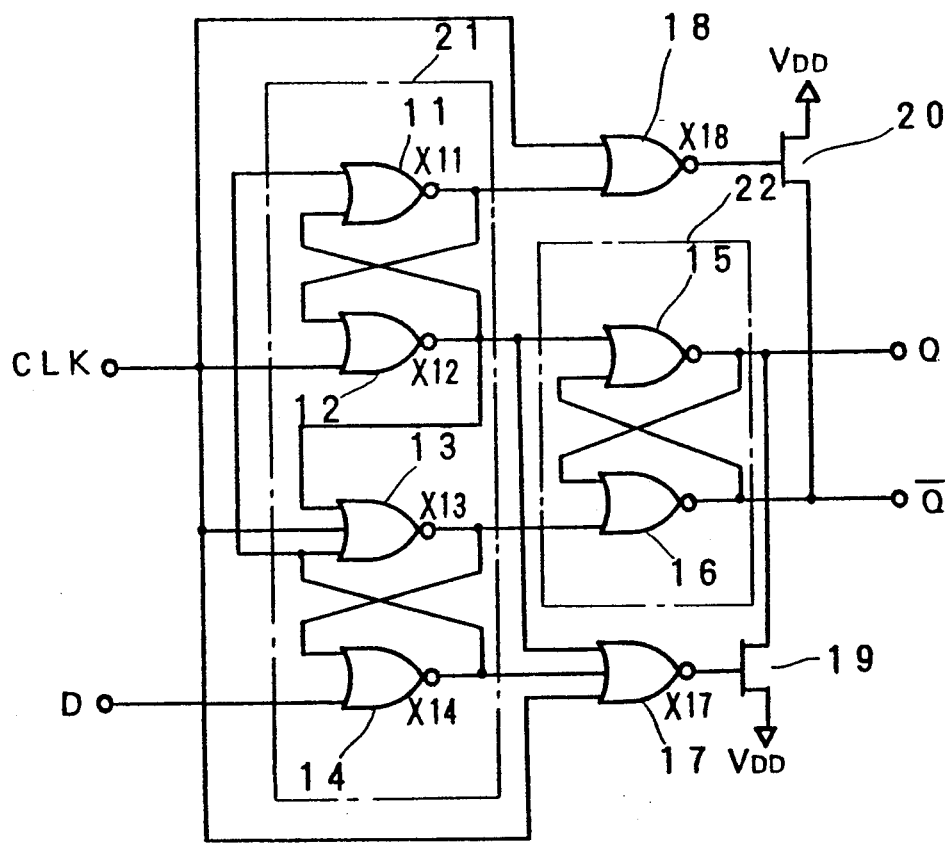
FIG. 2 shows an embodiment of a flip-flop circuit of the present invention.

FIG. 2 shows a circuit diagram of one embodiment of the present invention. Like FIG. 1, the flip-flop circuit of the present embodiment comprises a data take-in circuit 21 which includes four NOR gates 11–14 and a data hold circuit 22 which includes NOR gates 15 and 16. It further comprises a data output forced update circuit which includes two FET's 19 and 20, and two NOR gates 17 and 18. Inputs to the NOR gates 17 and 18 are common to inputs to the NOR gates 13 and 12, respectively. Outputs of the NOR gates 17 and 18 are gate inputs to the FET's 19 and 20 which are connected between a power supply VDD and output terminals Q and $\overline{Q}$.

Figure 3:
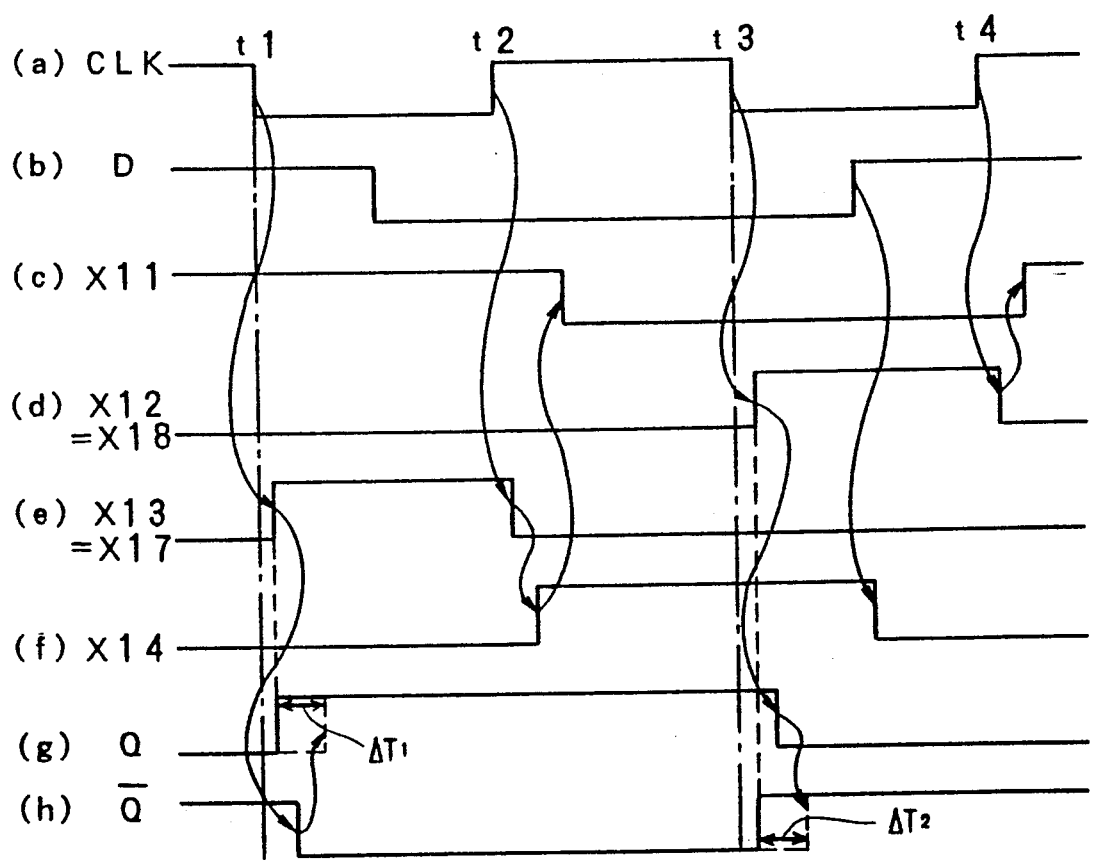
FIG. 3 shows a timing chart of an operation thereof.

Signal waveforms at various points are shown in FIG. 3. A data input D ((b) in FIG. 3) is taken in at a fall timing t1 or t3 of a clock input CLK ((a) in FIG. 3). At the time t1, the data input D is at a high level and X13, which is one of the output signals of the data take-in circuit 21, changes to the high level. Thus, the data take-in circuit 21 takes in the data input D. On the other hand, since an input signal to the NOR gate 17 is same as the input signal to the NOR gate 13 which outputs the signal X13, an output signal X17 of the NOR gate 17 also changes at the same timing as the signal X13.

As the output signal X17 ((e) in FIG. 3) of the NOR gate 17 changes from the low level (L) to the high level (H), the FET 19 conducts and voltage level at the output Q become about VDD. That is, the output Q ((g) in FIG. 3) is changed from L to H. If the data output forced update circuit is not provided, the output $\overline{Q}$ ((h) in FIG. 3) is set to L through the NOR gate 16 after the output signal X13 ((e) in FIG. 3) of the NOR gate 13 has been changed to H, and the output Q is set to H through the NOR gate 15. By the function of the data output forced update circuit, the updating of the data is accelerated by the period $\Delta T_1$.

At the rise of the clock input CLK at the time t2, the signal X17 returns to L. Since the updated output has arrived through the normal route by that time, the output Q is held at H. As the signal X13 returns to L, the output signal X14 ((f) in FIG. 3) of the NOR gate 14 changes to H, and the output signal X11 ((c) in FIG. 3) of the NOR gate 11 changes to L.

If the data input D is L, as shown in FIG. 2 at the fall time (time t3) of the next clock input CLK, the FET 20 conducts when the output signal X18 ((d) in FIG. 3) of the NOR gate 18 changes to H, and the output $\overline{Q}$ changes from L to H. If the data output forced update circuit is not provided, the output Q is set to L through the NOR gate 15 after the output signal X12 ((d) in FIG. 3) of the NOR gate 12 has been changed to H, and the output $\overline{Q}$ is set to H through the NOR gate 16. Thus, the updating of the data is accelerated by the period $\Delta T_2$. At the time t4, the signal X18 returns to L at the rise of the clock input CLK but the output $\overline{Q}$ is held at H.

In the present embodiment, a toggle period which permits a normal operation and a time (delay time) from the change in the clock input CLK which causes the data input take-in timing to the setting of the output Q to the value determined by the data input (L to H in the present example) are determined by simulation and they are compared with those of FIG. 1.

|  | Present Embodiment | FIG. 1 |
| --- | --- | --- |
| Toggle Period | 1.52 GHz | 1.33 GHz |
| Delay Time | 323 Ps | 549 Ps |

Figure 4:
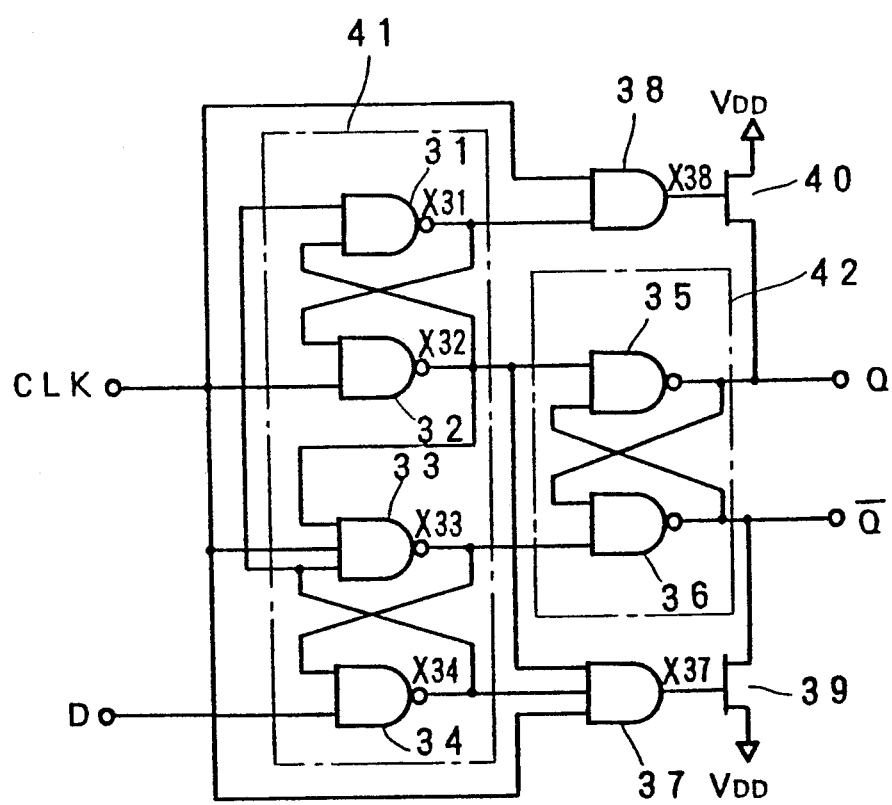
FIG. 4 shows a second embodiment of the flip-flop circuit of the present invention.

Although the present embodiment is applied to a negative edge trigger flip-flop circuit which takes in the data input D at the fall of the clock input CLK, the present invention is equally applicable to a positive edge trigger type. For example, FIG. 4 shows a flip-flop circuit which comprises a data take-in circuit 41 including four NAND gates 31–34 and a data hold circuit 42 including two NAND gates 35–36, a data output forced update circuit including FET's 39 and 40, and AND gate 37 having a common input to the NAND gate 33, and an AND gate 38 having a common input to the NAND gate 32.

Figure 5:
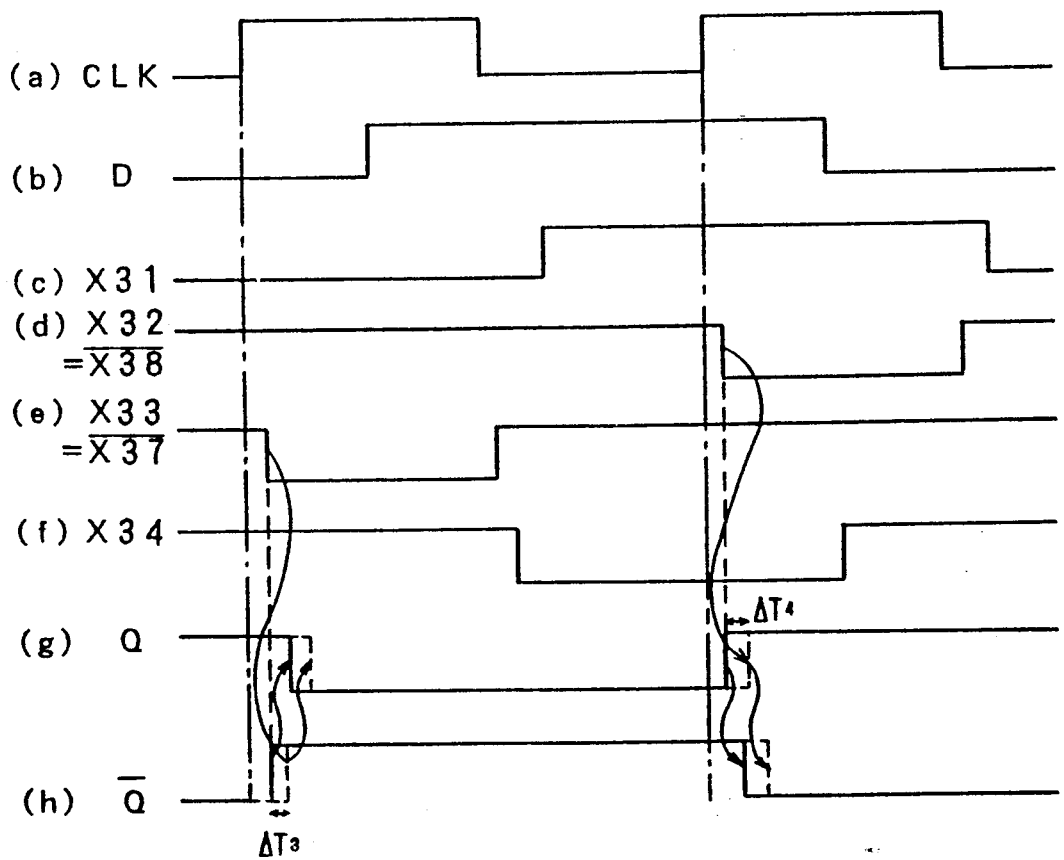
FIG. 5 shows a timing chart of an operation thereof.

FIG. 5 shows signal waveforms at various points. In the present embodiment, the rise and fall changes of the outputs Q and $\overline{Q}$ can be accelerated. For example, $\Delta T_3$ represents a difference between a delay by a route AND gate 37→FET 39 and a delay by a normal route NAND gate 33→NAND gate 36, and $\Delta T_4$ represents a difference between a delay by a route AND gate 38→FET 40 and a delay by a normal route NAND gate 32→NAND gate 35.

Figure 6:
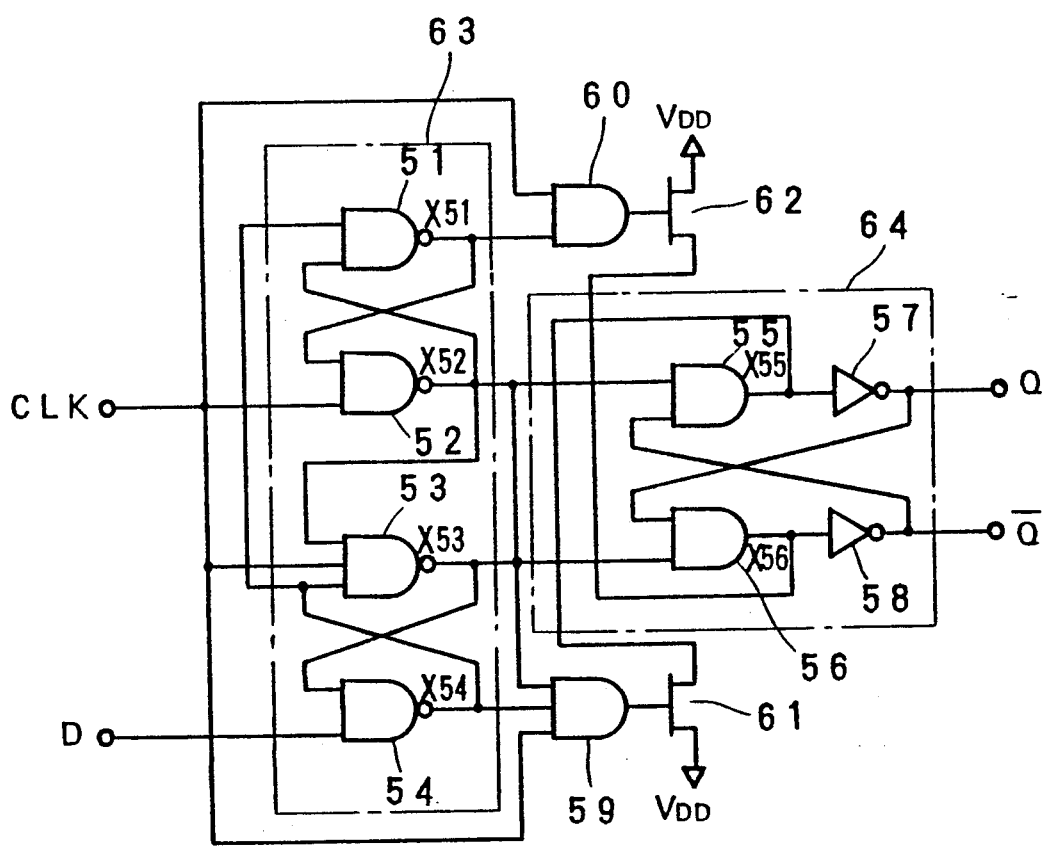
FIG. 6 shows a third embodiment of the flip-flop circuit of the present invention.
Figure 7:
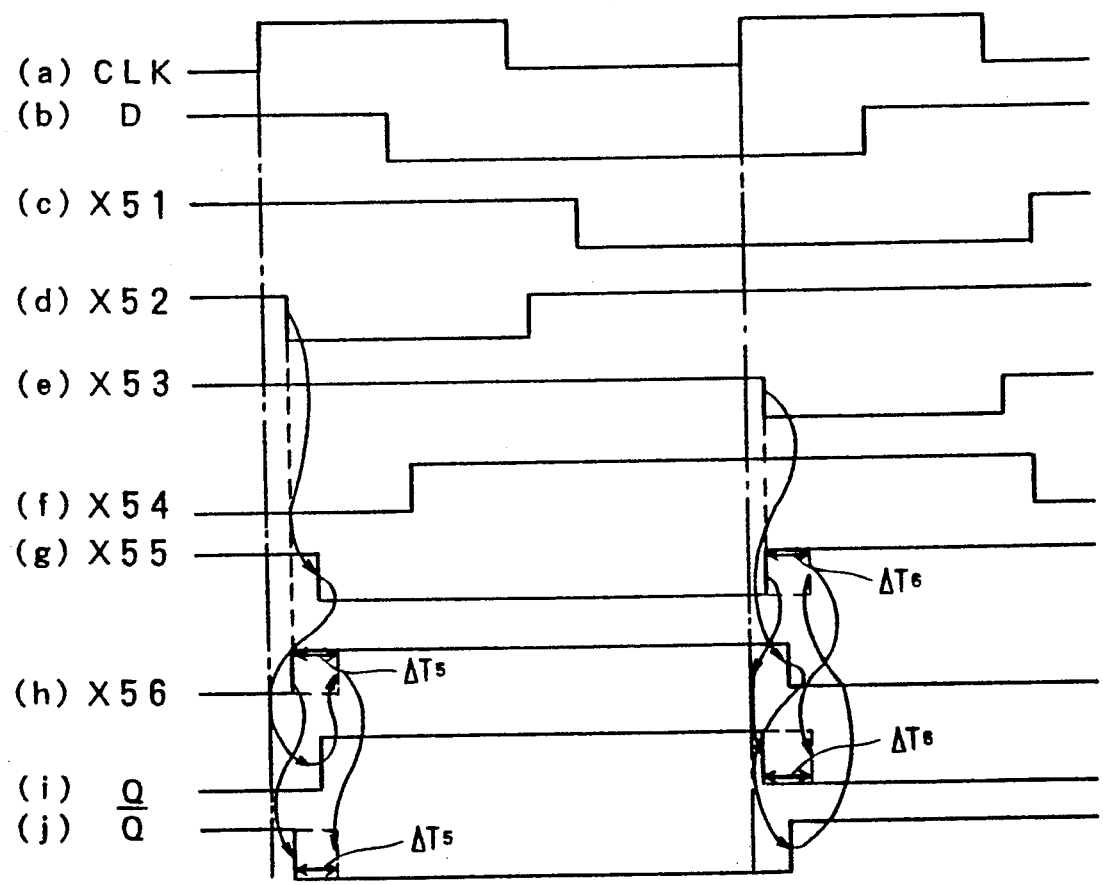
FIG. 7 shows a timing chart of an operation thereof.

A flip-flop circuit may be configured as shown in FIG. 6. It comprises a data take-in circuit 63 which includes NAND gates 51–54, a data hold circuit 64 which includes AND gates 55 and 56 and inverters 57 and 58, and a data output forced update circuit which includes FET's 61 and 62 which are switched by output signals of the AND gates 59 and 60. As seen from signal waveforms shown in FIG. 7, the changes in the rise and fall of the output Q and $\overline{Q}$ are accelerated.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:
1. A flip-flop circuit, comprising:
 a data take-in circuit (DTIC) means, having a data input and a clock input, for successively taking in a series of data inputs at said data input at successive data input times synchronized with a clock signal that is input at said clock input, said clock signal comprising a series of clock pulses, and for providing a first logical output, having successive states determined by said series of data inputs and said clock signal, and a second logical output;
 a data hold circuit (DHC) means, having an input terminal and an output terminal, for successively receiving at said input terminal said successive states of said first logical output and providing a DHC output at said output terminal having successive states determined by said successive states of said first logical output, each one of said successive states of said DHC output being held for a period of time starting at a time slightly after occurrence of one of said data input times until occurrence of an immediately succeeding one of said data input times; and
 a data output forced update circuit (DOFUC) means, responsive to said first logical output and said second logical output from said DTIC means, for temporarily setting said output terminal of said DHC means to a logical state which is substantially the same as that of an immediately succeeding one of said successive states of said DHC output to be provided at said output terminal by said DHC means and for maintaining said output terminal at said logical state until said immediately succeeding one of said successive states of said DHC output is provided at said output terminal by said DHC means.

2. A flip-flop circuit as in claim 1, wherein said DOFUC means includes a logic gate and a field effect transistor (FET) connected between said output terminal and a power supply, said logic gate providing a control signal to a gate of said FET to cause said FET to conduct to set said output terminal at said logical state determined by a voltage level of said power supply.

3. A flip-flop circuit as in claim 2, wherein said DTIC means and said DHC means respectively comprise a plurality of logic gates.

4. A flip-flop circuit as in claim 3, wherein said logic gate of said DOFUC means receives said first logical output and said second logical output from said DTIC means.

5. A flip-flop circuit as in claim 1, wherein said DTIC means and said DHC means respectively comprise a plurality of logic gates.

6. A flip-flop circuit as in claim 5, wherein said logic gate of said DOFUC means receives said first logical output and said second logical output from said DTIC means.

7. A flip-flop circuit as in claim 1, wherein:
 said DTIC means provides a third logical output, having successive states determined by said series of data inputs and said clock signal, and a fourth logical output;

said DHC means includes a second input terminal and a second output terminal, for successively receiving at said second input terminal said successive states of said third logical output and providing a second DHC output at said second output terminal having successive states determined by said successive states of said third logical output, each one of said successive states of said second DHC output being held for a period of time starting at a time slightly after occurrence of one of said data input times until occurrence of an immediately succeeding one of said data input times; and said DOFUC means, responsive to said third logical output and said fourth logical output from said DTIC means, temporarily sets said second output terminal of said DHC means to an inverted logical state which is inverted relative to that of an immediately succeeding one of said successive states of said DHC output to be provided at said first output terminal by said DHC means and for maintaining said second output terminal at said inverted logical state until a logical state which is inverted relative to said immediately succeeding one of said successive states of said DHC output is provided at said second output terminal by said DHC means.

8. A flip-flop circuit as in claim 1, wherein said DOFUC means includes a second logic gate and a second FET connected between said second output terminal and a second power supply, said second logic gate providing a second control signal to a gate of said second FET to cause said second FET to conduct to set said second output terminal at said inverted logical state determined by a voltage level of said power supply.

9. A flip-flop circuit as in claim 3, wherein said second logic gate of said DOFUC means receives said third logic output and said fourth logic output from said DTIC means.

* * * * *